United States Patent
Joo et al.

(10) Patent No.: US 8,228,736 B2
(45) Date of Patent: Jul. 24, 2012

(54) MOBILE SYSTEM ON CHIP (SOC) AND MOBILE TERMINAL USING THE MOBILE SOC, AND METHOD FOR REFRESHING A MEMORY IN THE MOBILE SOC

(75) Inventors: Jae Hoon Joo, Seongnam-si (KR); Sang Seok Kang, Suwon-si (KR); Jong Hyoung Lim, Hwasung-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 303 days.

(21) Appl. No.: 12/591,976

(22) Filed: Dec. 7, 2009

(65) Prior Publication Data

US 2010/0142291 A1 Jun. 10, 2010

(30) Foreign Application Priority Data

Dec. 8, 2008 (KR) .................. 10-2008-0124190

(51) Int. Cl.
*G11C 16/04* (2006.01)
(52) U.S. Cl. .............. 365/185.15; 365/222; 365/201; 365/200; 365/212; 365/211; 365/196
(58) Field of Classification Search ........... 365/185.15, 365/222, 201, 200, 212, 211, 196
See application file for complete search history.

(56) References Cited

U.S. PATENT DOCUMENTS

| | | | |
|---|---|---|---|
| 5,828,619 A | 10/1998 | Hirano et al. | |
| 6,545,921 B2* | 4/2003 | Ohtani et al. | 365/201 |
| 7,324,398 B2* | 1/2008 | Shim et al. | 365/212 |
| 7,436,727 B2* | 10/2008 | Jain et al. | 365/222 |
| 7,451,348 B2* | 11/2008 | Pecone et al. | 714/14 |
| 7,548,478 B2* | 6/2009 | Lee | 365/222 |
| 7,583,553 B2 | 9/2009 | Mori | |

FOREIGN PATENT DOCUMENTS

| | | |
|---|---|---|
| JP | 2007-310983 A | 11/2007 |
| KR | 10-0232749 B1 | 12/1999 |
| KR | 10-0650989 B1 | 11/2006 |

* cited by examiner

*Primary Examiner* — Connie Yoha
(74) *Attorney, Agent, or Firm* — Lee & Morse, P.C.

(57) ABSTRACT

A mobile System on Chip (SoC) comprises a microprocessor and a first memory controller configured to control a refresh of a first memory. A temperature sensor detects a temperature in the first memory. When first temperature information received from the temperature sensor indicates that the detected temperature deviates from a predetermined temperature range, the first memory controller controls the first memory so as not to perform a self refresh. When second temperature information received from the temperature sensor indicates that the detected temperature is in the predetermined temperature range, the first memory controller outputs a self refresh command to the first memory.

17 Claims, 2 Drawing Sheets

MOBILE SYSTEM ON CHIP (SOC) AND MOBILE TERMINAL USING THE MOBILE SOC, AND METHOD FOR REFRESHING A MEMORY IN THE MOBILE SOC

BACKGROUND

1. Field

Embodiments relate to a mobile System on Chip (SoC), a mobile terminal using the mobile SoC, and a method for refreshing a memory in the mobile SoC, and more particularly, to a mobile SoC capable of stably operating even at a temperature deviating from a general guaranteeing temperature, a mobile terminal using the mobile SoC, and a method for refreshing a memory in the mobile SoC.

2. Description of the Related Art

As a mobile terminal provides higher performance, heat emission of a volatile memory, such as a DRAM, in an SoC causes the entire mobile terminal to perform unstable operations. Particularly, since each cell of the volatile memory includes a capacitor having a small capacity, data loss caused by the heat emission results in errors in the data stored in the volatile memory. Consequently, the mobile terminal may perform an erroneous operation.

A volatile memory generally requires a refresh. To perform a self refresh in the volatile memory, a self refresh command is output from an SoC to the volatile memory, and the volatile memory automatically performs a refresh with a predetermined period until the volatile memory receives an operation stop command. A refresh cycle is determined based on a cycle of an internal counter of the volatile memory. Since determination of the refresh cycle depends on the internal counter of the volatile memory, an external device to control the refresh cycle.

Recently, a high frequency has been used to improve the performance of a mobile terminal. However, when the temperature of a mobile terminal increases to a temperature equal to or greater than the guaranteeing temperature by the heat emission of an SoC and a volatile memory using such a high frequency, it is difficult to guarantee a self refresh of the volatile memory. Therefore, a mobile SoC that allows a volatile memory and a mobile terminal to perform stable operations, and a mobile terminal using the mobile SoC are demanded.

SUMMARY

Embodiments are therefore directed to a mobile SoC, a mobile terminal using the mobile SoC, and a method for refreshing a memory in the mobile SoC, which substantially overcome one or more of the problems due to the limitations and disadvantages of the related art.

It is therefore a feature of an embodiment to provide a mobile SoC comprising: a microprocessor; and a first memory controller configured to control a refresh of a first memory, wherein a temperature sensor detects a temperature in the first memory, and when first temperature information received from the temperature sensor indicates that the detected temperature deviates from a predetermined temperature range, the first memory controller controls the first memory so as not to perform a self refresh.

The mobile SoC may further comprise a second memory controller, wherein when the first temperature information received indicates that the detected temperature deviates from the predetermined temperature range, the first memory controller reads at least a part of data stored in the first memory and outputs the read data to the second memory controller, and a second memory controller controls the output data so as to be stored in the second memory.

When the first memory is in a self refresh operation, the first memory controller may output at least one of a self refresh prevention signal and an auto refresh command to the first memory at a cycle corresponding to the first temperature information.

When the received first temperature information indicates that the detected temperature deviates from the predetermined temperature range, the first memory controller may output a first control signal to the microprocessor, and in response to the first control signal, the microprocessor may change a frequency of a clock signal generated by the microprocessor.

The mobile SoC may further comprise a peripheral controller, wherein when the received first temperature information indicates that the detected temperature deviates from the predetermined temperature range, the first memory controller may output a second control signal to the peripheral controller, and the peripheral controller may control a peripheral so as to output a warning signal in response to the second control signal.

When second temperature information received from the temperature sensor indicates that the detected temperature is in the predetermined temperature range, the first memory controller may output a self refresh command to the first memory.

The first memory may be a volatile memory, and the second memory may be a non-volatile memory.

The predetermined temperature range may be a guaranteeing temperature of the first memory.

It is therefore another feature of an embodiment to provide a mobile SoC, comprising: a first memory controller configured to control a refresh of a first memory; and a second memory controller configured to an operation of a second memory, wherein a temperature sensor included in the first memory detects a temperature in the first memory, and when temperature information received from the temperature sensor indicates that the detected temperature deviates from a predetermined temperature range, the first memory controller reads at least a part of data stored in the first memory and outputs the read data to the second memory controller, and a second memory controller controls the output data so as to be stored in the second memory.

It is therefore another feature of an embodiment to provide a mobile System on Chip (SoC) comprising: a microprocessor; and a first memory controller configured to control a refresh of a first memory, wherein when the first temperature information received indicates that the detected temperature deviates from the predetermined temperature range, the first memory controller outputs a first control signal to the microprocessor, and in response to the first control signal, the microprocessor changes a frequency of a clock signal generated by the microprocessor.

It is therefore another feature of an embodiment to provide a mobile terminal including any of the above-described mobile SoCs and the first memory.

The mobile terminal may further include the second memory.

It is therefore another feature of an embodiment to provide a method for refreshing a memory in an SoC, comprising: detecting a temperature in a first memory with a temperature sensor; receiving temperature information with a first memory controller from the temperature sensor; and controlling a first memory with the first memory controller so as not to perform a self refresh, when the first temperature indicates that the detected temperature deviates from a predetermined temperature.

The method may further comprise: outputting at least one of a self refresh prevention signal and an auto refresh command to the first memory at a cycle corresponding to the first temperature information, when the first memory is in a self refresh operation.

The method may further comprise: reading at least a part of data stored in the first memory when the first temperature information received indicates that the detected temperature deviates from the predetermined temperature range; outputting the read data to the second memory controller from the first memory; and controlling the output data with the second memory controller so as to be stored in the second memory.

The method may further comprise: outputting a first control signal from the first memory controller to a microprocessor when the first temperature information received indicates that the detected temperature deviates from the predetermined temperature range; and in response to the first control signal, changing a frequency of a clock signal with the microprocessor, the clock signal generated by the microprocessor.

The method may further comprise: outputting a second control signal from the first memory controller to a peripheral controller when the first temperature information received indicates that the detected temperature deviates from the predetermined temperature range; and in response to the second control signal, controlling a peripheral with the peripheral controller so as to output a warning signal.

The method may further comprise: outputting a self refresh command from the first memory controller to the first memory when second temperature information received from the temperature sensor indicates that the detected temperature is in the predetermined temperature range.

The first memory may be a volatile memory, and the second memory may be a non-volatile memory.

The predetermined temperature range may be a guaranteeing temperature of the first memory.

It is therefore another feature of an embodiment to provide a method for refreshing a memory in an SoC, comprising: detecting a temperature in a first memory with a temperature sensor; reading at least a part of data stored in the first memory with a first memory controller, when temperature information received from the temperature sensor indicates that the detected temperature deviates from a predetermined temperature range; outputting the read data from the first memory controller to the second memory controller; and controlling the output data with a second memory controller so as to be stored in the second memory.

The method may further comprise: outputting at least one of a self refresh prevention signal and an auto refresh command to the first memory at a cycle corresponding to the first temperature information, when the first memory is in a self refresh operation.

The method may further comprise: outputting a second control signal from the first memory controller to a peripheral controller when the first temperature information received indicates that the detected temperature deviates from the predetermined temperature range; and in response to the second control signal, controlling a peripheral with the peripheral controller so as to output a warning signal.

The method may further comprise: outputting a self refresh command from the first memory controller to the first memory when second temperature information received from the temperature sensor indicates that the detected temperature is in the predetermined temperature range.

The first memory may be a volatile memory, and the second memory may be a non-volatile memory.

The predetermined temperature range may be a guaranteeing temperature of the first memory.

The embodiments provide a mobile SoC, a terminal comprising the mobile SoC, and a method that may adaptively change a refresh way of a volatile memory (for example, a DRAM) according to temperature information received from a temperature sensor embedded in the volatile memory, and a mobile terminal using the mobile SoC. The embodiments also provide a mobile SoC, a terminal comprising the mobile SoC, and a method capable of controlling the entire system of a mobile terminal so that the temperature of the system returns to a temperature in a normal range.

BRIEF DESCRIPTION OF THE DRAWINGS

The above and other features and advantages of the embodiments will become more apparent to those of ordinary skill in the art by describing in detail exemplary embodiments with reference to the attached drawings, in which.

DETAILED DESCRIPTION

Korean Patent Application No. 10-2008-0124190, filed on Dec. 8, 2008, in the Korean Intellectual Property Office, and entitled: "Mobile System on Chip (SoC) and Mobile Terminal Using the Mobile SoC," is incorporated by reference herein in its entirety.

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

Figure 1:
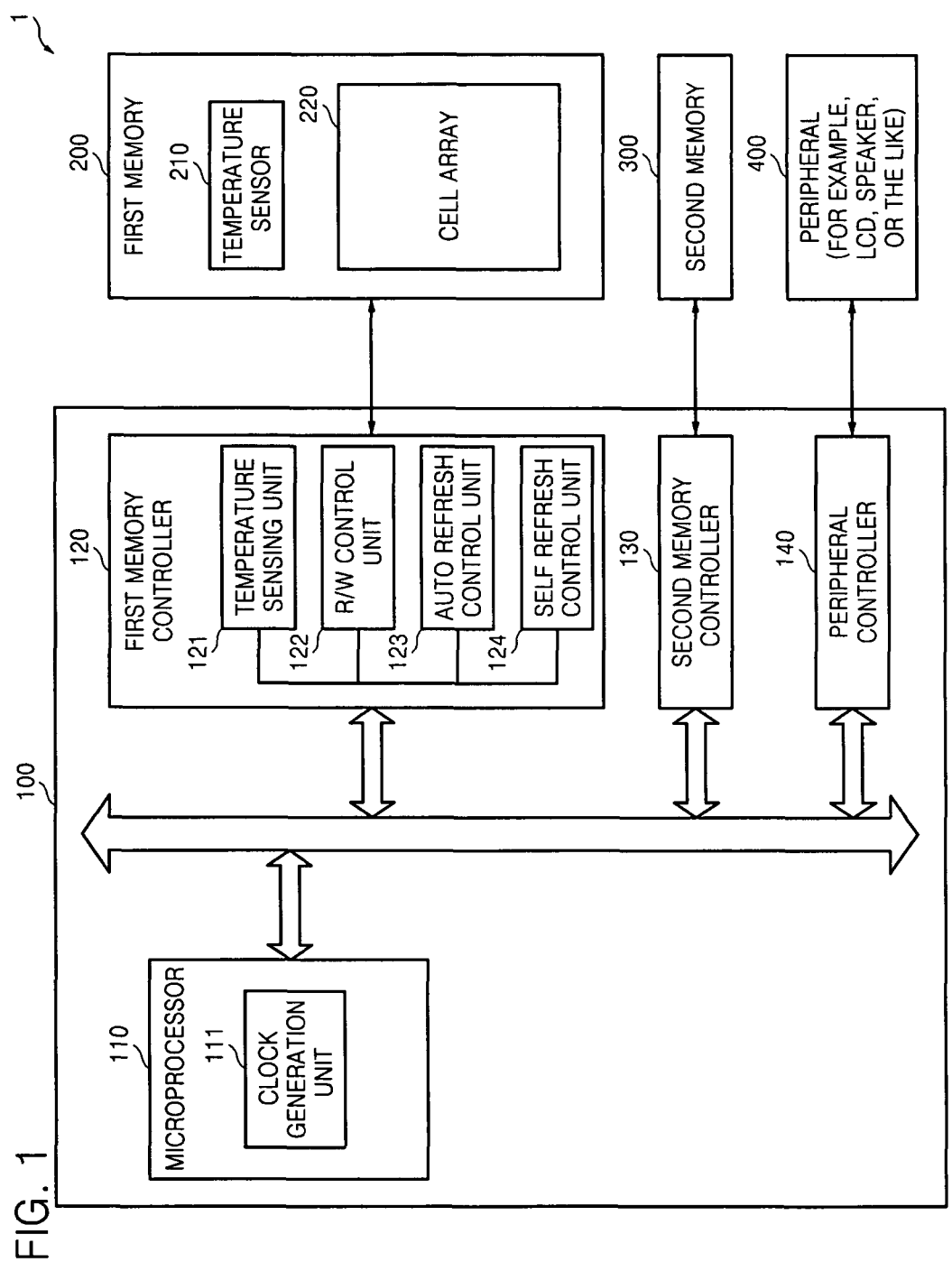
FIG. 1 illustrates a block diagram of a structure of a mobile terminal according to the exemplary embodiments.

FIG. 1 illustrates a block diagram of a structure of a mobile terminal 1 according to exemplary embodiments. Referring to FIG. 1, the mobile terminal 1 may include a SoC 100 and a first memory 200. The mobile terminal 1 may further include a second memory 300 and/or a peripheral 400 such as an LCD, a cooler, a speaker, or the like.

The mobile SoC 100 may include a microprocessor 110 and a first memory controller 120 configured to control an operation of the first memory 200. According to the embodiments, the mobile SoC 100 may further include a second memory controller 130 configured to control an operation of the second memory 300, and/or a peripheral controller 140 configured to control the peripheral 400.

The microprocessor 110 may include a clock generation unit 111. The first memory controller 120 may include a temperature sensing unit 121, a Read/Write (R/W) control unit 122, an auto refresh control unit 123, and a self refresh control unit 124.

The first memory 200 may include a cell array 220 and a temperature sensor 210 configured to detect a temperature in the first memory 200. The first memory 200 may be a volatile memory. For example, the first memory 200 may be implemented using a DRAM. The second memory 300 may be a non-volatile memory. Alternatively, if the second memory 300 is a volatile memory if, due to its temperature characteristics, an error may not be generated in stored data under increased or decreased temperature. The second memory 300 may be implemented into a flash memory or an EEPROM.

As the peripheral 400, various peripherals may be used according to the type of the mobile terminal 1. For example, the peripheral 400 may be an LCD module, a speaker, a cooler, or the like.

The microprocessor 110 may generate and output control signals for controlling a computing operation of data required by the mobile terminal 1 and the other components of the mobile terminal 1. The clock generation unit 111 may generate a clock signal which is used in the mobile terminal 1. The components of the mobile terminal 1 may operate in response to the clock signal. Instead of the clock generation unit 111 included in the microprocessor 110, a separate component configured to generate a clock signal may be included in the mobile terminal 1.

The temperature sensing unit 121 of the first memory controller 120 may periodically receive temperature information from the temperature sensor 210 of the first memory 200. In an operation-guaranteeing temperature range, the first memory 200 may stably perform a self refresh. The operation-guaranteeing temperature may be predetermined. If it is determined that currently received temperature information indicates that the temperature detected by the temperature sensor 210 deviates from the predetermined operation-guaranteeing temperature range while the temperature sensing unit 121 periodically receives temperature information, the first memory controller 120 may control the first memory 200 so as not to perform a self refresh. Otherwise, if the first memory 200 continues to perform a self refresh even when the received temperature information indicates that the temperature detected by the temperature sensor 210 deviates from the operation-guaranteeing temperature range, an error may occur in the data stored in the cell array 220 of the first memory 200.

Figure 2:
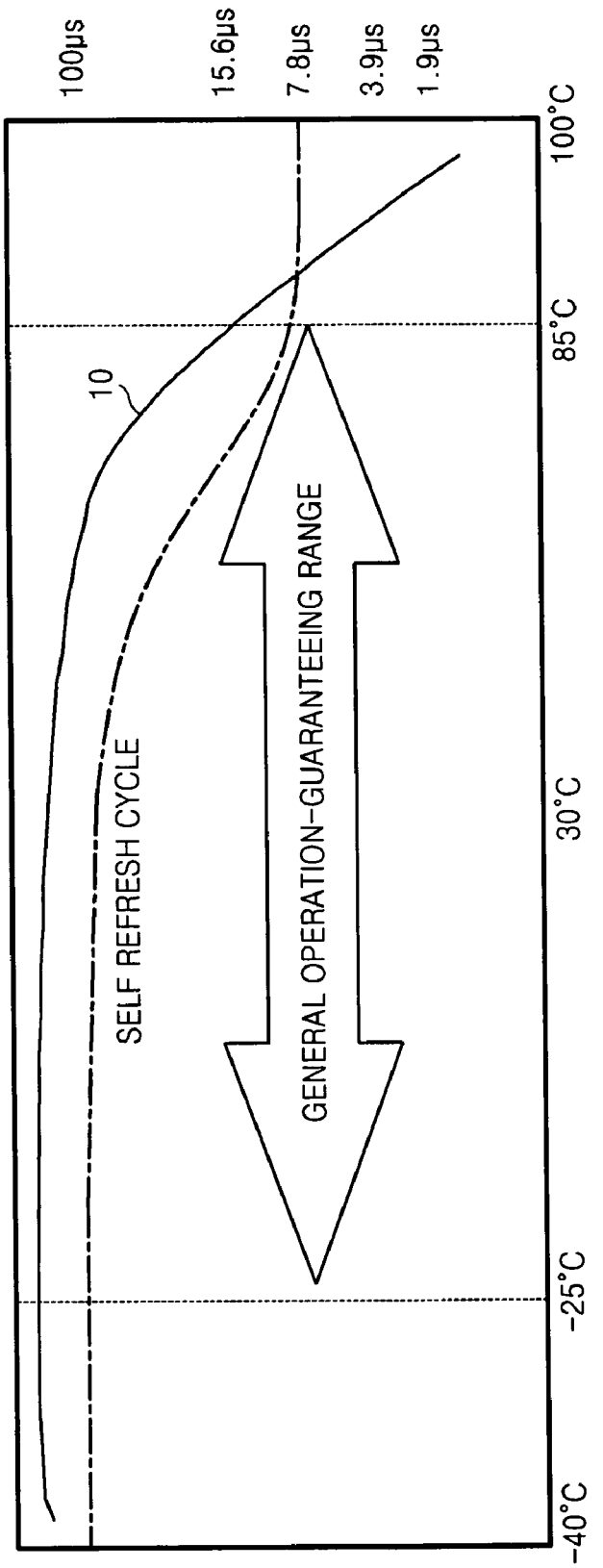
FIG. 2 presents a graph for explaining a refresh method according to the exemplary embodiments.

FIG. 2 presents a graph for explaining a refresh method according to the embodiments. Referring to FIG. 2, a general self refresh cycle of a volatile memory (for example, a DRAM) may be designed to have cycle characteristics as depicted by a dotted line of FIG. 2. The self refresh cycle may decrease as the temperature of the volatile memory increases. Further, if the temperature deviates from the operation-guaranteeing temperature range, the self refresh cycle may be limited, or may not decrease any more. Accordingly, if the volatile memory continues a self refresh even when the temperature deviates from an operation-guaranteeing temperature range, which is for example, from −25° C. to 85° C., the volatile memory fails to adaptively perform a refresh according to the temperature, and thereby causing data degradation.

In other words, it may be ideal that the self refresh cycle continuously decreases even when the temperature deviates from the general operation-guaranteeing temperature range, as depicted by a solid line 10 of FIG. 2. Accordingly, the first memory controller 120 may control the first memory 200 so as not to perform the self refresh, and may control the self refresh cycle to have the cycle depicted by the solid line 10.

Referring back to FIG. 1, the self refresh control unit 124 of the first memory controller 120 may output a self refresh prevention signal or a self refresh interrupt signal to the first memory 200 so that the first memory 200 does not perform the self refresh any more.

Then, the first memory 200 may stop the self refresh. The first memory 200 may perform a refresh in response to an auto refresh command received from the first memory controller 120. An auto refresh is a refresh that is performed by the first memory 200 every time the auto refresh command is received from the first memory controller 120. To this end, the auto refresh control unit 123 of the first memory controller 120 may output the auto refresh command to the first memory 200 at a cycle corresponding to received temperature information.

The first memory controller 120 may recognize the cycle corresponding to the received temperature information in various ways. For example, information about a cycle corresponding to temperature information to be received may be stored beforehand in a predetermined storage device (not shown). Alternatively, a cycle corresponding to temperature information received from the first memory controller 120 or the microprocessor 110 may be computed in real time using a predetermined algorithm, and the first memory controller 120 may output an auto refresh command to the first memory 200 on the basis of the computed cycles.

As described above, the first memory controller 120 may control the first memory 200 so as to adaptively perform a refresh even at a temperature deviating from the operation-guaranteeing temperature range. If a temperature of the first memory 200 or the mobile terminal 1 returns to a temperature in the operation-guaranteeing temperature range, the first memory controller 120 may output a self refresh command to the first memory 200 and control the first memory 200 so as to perform a self refresh.

The mobile terminal 1 may return to the temperature in the operation-guaranteeing temperature range in various methods described below.

When the temperature of the first memory 200 deviates from the operation-guaranteeing temperature range, the data stored in the cell array 220 of the first memory 200 may be unstable. To prevent this, the data stored in the first memory 200 may be stored in the second memory 300 by the mobile SoC 100 alternatively.

To this end, if first temperature information received indicates that a temperature detected by the temperature sensor 210 deviates from the operation-guaranteeing temperature range, the first memory controller 120 may read out at least a part of the data stored in the first memory 200 and output the read-out data to the second memory controller 130. In turn, the second memory controller 130 may control at least a part of the received read-out data so as to be stored in the second memory 300. In other words, the second memory controller 130 may control at least a part of received data so as to be written onto the second memory 300. To achieve this, the mobile terminal 1 may further include a predetermined direct memory access (DMA; not shown). The predetermined DMA may control data transmission from the first memory controller 120 to the second memory controller 130.

The mobile SoC 100 may copy the data stored in the first memory 200 into the second memory 300 by using or without using the above-described refresh method. Thus, the data stored in the first memory 200 may be preserved by the use of the above-described method and/or the first and second memory controllers.

The second memory 300 may be a storage device capable of stably storing data regardless of a temperature of the storage device. For example, the second memory 300 may be implemented into a flash memory as a non-volatile memory. Alternatively, the second memory 300 may be volatile a storage device that is less affected by a current temperature of the storage device than the first memory 200.

According to the embodiments, a refresh operation of the first memory 200 may be performed adaptively even at a temperature deviating from an operation-guaranteeing temperature range. Accordingly, degradation of the data stored in the first memory 200 may be prevented. Several adverse influences may be exerted on the system in the mobile terminal 1 if the temperature of the mobile terminal 1 deviates from the operation-guaranteeing temperature range. However, such adverse influences may also be minimized. In other words, the embodiments may provide a method for returning a temperature of the mobile terminal 1 to a temperature in the operation-guaranteeing temperature range.

To this end, if received temperature information indicates that a temperature detected by the temperature sensor deviates from a predetermined range (for example, an operation-guaranteeing temperature range), the first memory controller 120 may output a control signal to the microprocessor 110, and the microprocessor 110 may change a frequency of a clock signal generated by the clock generation unit 111 of the microprocessor 110 in response to the control signal. For example, when the mobile terminal 1 has a high temperature above the operation-guaranteeing temperature range, the first memory controller 120 may output a control signal to the microprocessor 110. Then, the microprocessor 110 may decrease the frequency of the clock signal generated by the clock generation unit 111, thereby reducing heat emission. On the other hand, the mobile terminal 1 may have a low temperature below the operation-guaranteeing temperature range. If the first memory 200 is implemented using a DRAM, cell contact resistance of each cell of the DRAM may increase at such a low temperature. (The cell contact resistance may be represented as the frequency margin characteristics of a write clock.) At this time, the microprocessor 110 may reduce the frequency of the clock signal. Accordingly, the frequency margin characteristics of the write clock may be reduced.

In addition, if the received temperature information indicates that the temperature detected by the temperature sensor 210 deviates from the predetermined range (for example, the operation-guaranteeing temperature range), the first memory controller 120 may output a control signal to the peripheral controller 140. In turn, the peripheral controller 140 may control the peripheral 400 so as to output a warning signal in response to the control signal. The control signal may also be output to the peripheral controller 140 via the microprocessor 110. For example, if the peripheral 400 is an LCD module, a message indicating that the temperature of the mobile terminal 1 is too high or too low may be displayed on the LCD module. If the peripheral 400 is a speaker, the peripheral 400 may use an audio warning that induces a user to take a predetermined measure for returning the temperature of the mobile terminal 1 to a temperature in the operation-guaranteeing temperature range. Also, the first memory controller 120 may output a control signal to a cooler (not shown) included in the mobile terminal 1 or to a controller (not shown) for the cooler according to received temperature information so that the cooler may adaptively operate according to the temperature of the mobile terminal 1. By operating the cooler, power consumption of the mobile terminal 1 may be reduced. For example, if a temperature recognized by the first memory controller 120 is in the operation-guaranteeing temperature range, the power of the cooler may be controlled to be lower. If the temperature recognized by the first memory controller 120 is high beyond the operation-guaranteeing temperature range, the power of the cooler may be controlled to be higher. The control signal may be output from the first memory controller 120 to the cooler via the microprocessor 110.

As described above, according to the embodiments, all of the components of the mobile terminal 1 may be controlled by using temperature information generated in the temperature sensor 210 of the volatile memory 200 (for example, a DRAM) so that the mobile terminal 1 performs stable operations.

According to a mobile SoC and a mobile terminal using the mobile SoC according to the embodiments, when the temperature of the mobile terminal in a goods-forwarding or testing stage deviates from a temperature range in which a self refresh is guaranteed, a refresh cycle may be controlled so as to adapt to the temperature by changing a refresh method of a volatile memory (for example, a DRAM). Accordingly, generation of errors in the data stored in the volatile memory (for example, a DRAM) may be prevented. Furthermore, when the temperature of the mobile terminal deviates from a certain temperature range, various components associated with the temperature of the mobile terminal may be controlled so that the temperature of the mobile terminal may return to a temperature in a normal range. Therefore, the system in the mobile terminal may stably operate.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A mobile System on Chip (SoC) comprising:
   a microprocessor;
   a first memory controller configured to control a refresh of a first memory; and
   a second memory controller configured to control a second memory,
   wherein a temperature sensor detects a temperature in the first memory, and when first temperature information received from the temperature sensor indicates that the detected temperature deviates from a predetermined temperature range, the first memory controller controls the first memory so as not to perform a self refresh, and
   wherein when the first temperature information received indicates that the detected temperature deviates from the predetermined temperature range, the first memory controller reads at least a part of data stored in the first memory and outputs the read data to the second memory controller, and the second memory controller controls the output data so as to be stored in the second memory.

2. The mobile SoC as claimed in claim 1, wherein when the first memory is in a self refresh operation, the first memory controller outputs at least one of a self refresh prevention signal and an auto refresh command to the first memory at a cycle corresponding to the first temperature information.

3. The mobile SoC as claimed in claim 1, wherein the first memory is a volatile memory, and the second memory is a non-volatile memory.

4. The mobile SoC as claimed in claim 1, wherein when the first temperature information received indicates that the detected temperature deviates from the predetermined temperature range, the first memory controller outputs a first control signal to the microprocessor, and in response to the first control signal, the microprocessor changes a frequency of a clock signal generated by the microprocessor.

5. The mobile SoC as claimed in claim 1, further comprising a peripheral controller,
   wherein when the received first temperature information indicates that the detected temperature deviates from the predetermined temperature range, the first memory controller outputs a second control signal to the peripheral controller, and the peripheral controller controls a peripheral so as to output a warning signal in response to the second control signal.

6. The mobile SoC as claimed in claim 1, wherein when second temperature information received from the temperature sensor indicates that the detected temperature is in the predetermined temperature range, the first memory controller outputs a self refresh command to the first memory.

7. The mobile SoC as claimed in claim 1, wherein the predetermined temperature range is an operation-guaranteeing temperature range of the first memory.

8. A mobile SoC, comprising:
a first memory controller configured to control a refresh of a first memory; and
a second memory controller configured to an operation of a second memory,
wherein a temperature sensor detects a temperature in the first memory, and when temperature information received from a temperature sensor indicates that the detected temperature deviates from a predetermined temperature range, the first memory controller reads at least a part of data stored in the first memory and outputs the read data to the second memory controller, and the second memory controller controls the output data so as to be stored in the second memory.

9. The mobile SoC as claimed in claim 8, wherein when the first memory is in a self refresh operation, the first memory controller outputs at least one of a self refresh prevention signal and an auto refresh command to the first memory at a cycle corresponding to the first temperature information.

10. The mobile SoC as claimed in claim 8, further comprising a peripheral controller,
wherein when the received first temperature information indicates that the detected temperature deviates from the predetermined temperature range, the first memory controller outputs a second control signal to the peripheral controller, and the peripheral controller controls a peripheral so as to output a warning signal in response to the second control signal.

11. The mobile SoC as claimed in claim 8, wherein when second temperature information received from the temperature sensor indicates that the detected temperature is in the predetermined temperature range, the first memory controller outputs a self refresh command to the first memory.

12. A mobile SoC, comprising:
a microprocessor;
a first memory controller configured to control a refresh of a first memory; and
a peripheral controller,
wherein if the first temperature information received indicates that the detected temperature deviates from the predetermined temperature range, the first memory controller outputs a first control signal to the microprocessor, and in response to the first control signal, the microprocessor changes a frequency of a clock signal generated by the microprocessor, and
wherein when the received first temperature information indicates that the detected temperature deviates from the predetermined temperature range, the first memory controller outputs a second control signal to the peripheral controller, and the peripheral controller controls a peripheral so as to output a warning signal in response to the second control signal.

13. The mobile SoC as claimed in claim 12, wherein when second temperature information received from the temperature sensor indicates that the detected temperature is in the predetermined temperature range, the first memory controller outputs a self refresh command to the first memory.

14. A mobile terminal, comprising:
the mobile SoC as claimed in claim 1; and
a self refresh control unit in the mobile SoC, the self refresh control unit being configured to completely stop performance of self refresh operations of the first memory.

15. A mobile terminal, comprising:
the mobile SoC as claimed in claim 1; and
a non-volatile memory controlled by the mobile SoC.

16. The mobile terminal as claimed in claim 15,
wherein the mobile SoC further comprises a second memory controller configured to control the non-volatile memory, and
wherein when the first temperature information received indicates that the detected temperature deviates from the predetermined temperature range, the first memory controller reads at least a part of data stored in the first memory and outputs the read data to the second memory controller, and the second memory controller controls the output data so as to be stored in the non-volatile memory.

17. A mobile terminal, comprising:
the mobile SoC as claimed in claim 8,
wherein the second memory is a non-volatile memory.

* * * * *